(12) United States Patent  
Eisele

(10) Patent No.: US 9,040,338 B2
(45) Date of Patent: May 26, 2015

(54) POWER SEMICONDUCTOR MODULE WITH METHOD FOR MANUFACTURING A SINTERED POWER SEMICONDUCTOR MODULE

(75) Inventor: Ronald Eisele, Surendorf (DE)

(73) Assignee: Danfoss Silicon Power GmbH, Schleswig (DE)

( * ) Notice: Subject to any disclaimer, the term of this patent is extended or adjusted under 35 U.S.C. 154(b) by 119 days.

(21) Appl. No.: 13/883,348

(22) PCT Filed: Oct. 28, 2011

(86) PCT No.: PCT/DE2011/001905
§ 371 (c)(1),
(2), (4) Date: May 3, 2013

(87) PCT Pub. No.: WO2012/062274
PCT Pub. Date: May 18, 2012

(65) Prior Publication Data
US 2013/0228890 A1 Sep. 5, 2013

(30) Foreign Application Priority Data
Nov. 5, 2010 (DE) .......................... 10 2010 050 315

(51) Int. Cl.
H01L 21/00 (2006.01)
H01L 37/00 (2006.01)
(Continued)

(52) U.S. Cl.
CPC  *H01L 37/00* (2013.01); *G01K 7/16* (2013.01);
*H01L 23/15* (2013.01); *H01L 23/34* (2013.01);
*H01L 24/49* (2013.01); *H01L 24/83* (2013.01);
*H01L 2224/48472* (2013.01);
(Continued)

(58) Field of Classification Search
CPC ................ H01L 2924/00014; H01L 2924/00;
H01L 2924/00012; H01L 2224/48227; H01L 2224/3225
USPC ........... 438/48, 54, 55; 257/426, 467, E23.08
See application file for complete search history.

(56) References Cited

U.S. PATENT DOCUMENTS 5,896,081 A 4/1999 Tzeng et al.
2002/0167065 A1* 11/2002 Graf et al. ..................... 257/467
(Continued)

FOREIGN PATENT DOCUMENTS

DE 101 22 363 A1 11/2002
DE 10 2007 046 900 A1 4/2009
(Continued)

OTHER PUBLICATIONS

Search Report for PCT Serial No. PCT/DE2011/001905 dated May 16, 2012.

*Primary Examiner* — Andy Huynh
(74) *Attorney, Agent, or Firm* — McCormick, Paulding & Huber LLP

(57) ABSTRACT

Method of manufacturing sinterable electrical components for jointly sintering with active components, the components in planar shape being provided with at least one planar lower face meant for sintering, and an electrical contact area on the face opposite to the sintering face being available in the form of a metallic contact face, whose upper side is contactable by means of a commonly known method of the group: wire bonding or soldering or sintering or pressure contacting, the component being a temperature sensor, whose lower face is provided with a sinterable metallization on a ceramic body, said ceramic body having two electrical contact faces for continued electrical connection.

12 Claims, 3 Drawing Sheets

(51) Int. Cl.
*G01K 7/16* (2006.01)
*H01L 23/15* (2006.01)
*H01L 23/34* (2006.01)
*H01L 23/00* (2006.01)

(52) U.S. Cl.
CPC ............... *H01L 2224/49111* (2013.01); *H01L 2224/8384* (2013.01); *H01L 2924/01025* (2013.01); *H01L 2924/01029* (2013.01); *H01L 2924/01032* (2013.01); *H01L 2924/01047* (2013.01); *H01L 2924/01058* (2013.01); *H01L 2924/19105* (2013.01); *H01L 2924/19107* (2013.01); *H01L 24/48* (2013.01); *H01L 2924/01005* (2013.01); *H01L 2924/0102* (2013.01); *H01L 2924/01074* (2013.01); *H01L 2924/01078* (2013.01); *H01L 2924/01079* (2013.01); *H01L 2924/014* (2013.01); *H01L 2924/13091* (2013.01); *H01L 2224/0603* (2013.01); *H01L 2224/48227* (2013.01); *H01L 2224/48091* (2013.01); *H01L 2924/07811* (2013.01)

(56) References Cited

U.S. PATENT DOCUMENTS

| | | | |
|---|---|---|---|
| 2009/0115567 A1* | 5/2009 | Wienand et al. | 338/25 |
| 2009/0134206 A1* | 5/2009 | Schmitt et al. | 228/198 |
| 2009/0140369 A1 | 6/2009 | Lee | |
| 2010/0055828 A1* | 3/2010 | Schmitt et al. | 438/98 |

FOREIGN PATENT DOCUMENTS

| | | |
|---|---|---|
| DE | 10 2008 035 993 A1 | 2/2010 |
| EP | 0 809 094 A1 | 11/1997 |
| EP | 1 286 144 A1 | 2/2003 |
| EP | 2 042 260 A2 | 4/2009 |
| JP | 4-102365 A | 4/1992 |

* cited by examiner

POWER SEMICONDUCTOR MODULE WITH METHOD FOR MANUFACTURING A SINTERED POWER SEMICONDUCTOR MODULE

CROSS REFERENCE TO RELATED APPLICATIONS

This application is entitled to the benefit of and incorporates by reference essential subject matter disclosed in International Patent Application No. PCT/DE2011/001905 filed on Oct. 28, 2011 and German Patent Application No. 10 2010 050 315.0 filed Nov. 5, 2010.

TECHNICAL FIELD

The invention concerns a power semiconductor module that consists of a common arrangement of sinterable components, for example, semiconductors, temperature sensors, compensating resistors for a chip, resistor and capacity elements, shunt resistors, in particular on available power conductor tracks according to the preamble of the main claim, and a method of manufacturing a sintered such module with temperature sensors. The objective is to obtain a method of manufacturing a sintered power semiconductor module by common sintering of a passive component with an active component.

BACKGROUND

In particular for automobile applications, power conductors are sought, which can safely, and within the smallest possible space, switch the high currents that flow, for example during start of a motor. Until now, this purpose has been met with power switches fixed on a base plate or a heat sink via an intermediately located substrate. Internal connections are realised by means of so-called bonded wires. A plastic housing accommodates connections, by means of which the module is connected to externally arranged cables.

In the state of the art, power conductors usually further consist of at least one semiconductor (transistor, diode or similar elements). For long-lived and temperature-stressed component groups the power semiconductor(s) is/are preferably joined on a substrate by sintering of silver layers. Such a low-temperature connection is mentioned in the DE 10 2008 035 993 A1 as an alternative.

In this connection, the substrate can be made as a punched metal grid or as a ceramic conductor plate with one or two-sided metal coatings for the current and heat transport. For the required function of the power component group, further, passive components, such as temperature sensors, chip compensating resistors, resistor and/or capacity elements and/or shunt resistors for current measuring, are required.

Typically, these components are inserted according to methods of traditional manufacturing techniques (gluing, soldering). In this connection, the prevailing designs are the surface mounted SMD-components (surface mounted devices), which can be either glued or soldered onto the substrate.

The geometries of these passive components are adapted to these manufacturing techniques and preferably utilise the meniscus formation of the joining glue (conducting glue) or the soft solder for electrical contact formation and mechanical fixing. In this connection, the components are usually cylindrical, however, at least provided with undercuts, which could cause damage or demolition during the pressing process of the sintering. The contacts of the SMD-components on the other hand are usually metallisations at both end covers, each circumferential. A thermally contacting and at the same time electrically isolatable mounting is not possible.

Further, in the power-electronic substrates a relatively thick conductor path layer is available, which is, with common SMD-components, separated from the active component by means of a (etched) groove. The grooves of the power conductor paths usually have a width of about 60 μm to 1000 μm and sometimes also more.

Manufacturing etched grooves will usually result in a groove width whose smallest dimension is the groove depth. With ceramic conductor plates of the type DCB (direct copper bonded) the structuring process of the copper conductor path, for example with the thickness of 380 μm, will also result in a groove width of at least 380 μm to 600 μm.

Substrates can basically be all commonly used conductor plates: ceramic core conductor plates (DCB), metal core conductor plates (IMS, insulated metal substrate), organic circuit carriers (for example epoxy resin core or poly imide core conductor plates).

However, this groove width is not suited for a safe bridging by SMD components and pressure sintering techniques. The following disadvantages and process incompatibilities occur:

- The circumferential end cover metallisations of the classic SMD-components require their own island contact faces within the faces of the power conductor paths. This reduces the required current carrying cross-section and the heat dissipation ability, as the heat flow will be stopped at the etched groove. Additional, cost intensive substrate surface will be required.
- For technology reasons, the groove width is relatively large and the sintering pressure breaks the bridging components.
- With temperature sensors of the classic design, the required island formation of the good conducting conductor path layer in the conductor path layout provides an additional thermal insulation and unduly reduces the response speed and the desired mirroring by the measured temperature of the transistor temperature.
- If, on the one hand, the power semiconductors are mounted by sintering, and the passive temperature sensors are mounted during a second step by soldering or gluing, the manufacturing and quality costs will be at least doubled. Soldering of the passive temperature sensor will require an additional manufacturing step "fluid cleaning" that requires a substantial amount of energy and stresses the environment.

SUMMARY

With the purpose of overcoming the disadvantages described, the main claim describes a method, in which at least one power semiconductor with at least one temperature sensor is mounted on a substrate by means of the sintering technique. The subclaims describe advantageous embodiments.

In particular, it is proposed to place a temperature sensor, for example one with a temperature sensitive platinum metal resistor, directly on the semiconductor.

Semiconductor modules contain the temperature sensor in order that the timely reaching of a limit temperature during operation can be detected.

When reaching such a limit temperature (for example 180° C.), the operating semiconductor is acutely threatened by overheating and can lose its function. In such a case, the controlled current through the semiconductor will usually be reduced in order to avoid thermal damage.

Therefore, the correct determination of the limit temperature by the temperature sensor is based on three boundary conditions:
1. The temperature sensor must be mounted as close to the semiconductor as ever possible and
2. with the best possible thermal contact (=the smallest possible thermal resistance) (avoidance of poorly conducting glues and electro-thermal conductor path islands) and
3. the temperature sensor measuring voltage must be electrically isolatable from the work potentials of the semiconductor.

Therefore, it is proposed to mount the temperature sensor in the following way:
directly on the semiconductor (=as close as possible, for example on the emitter switch of a power transistor),
with highly conductive joining materials (sintering silver), and
a ceramic layer or ceramic disc carrying the temperature sensor (for example Pt1000) and its two contact faces being electrically insulated in relation to the electrical potential of the semiconductor contact face.

In this way it is ensured that a temperature change of the semiconductor will, in the fastest possible way, reach the temperature sensitive platinum metal resistor of the temperature sensor via the thermal path of the silver sinter connection and the ceramic insulation. This fast response behaviour of the temperature sensor permits an essentially more efficient protection reaction of the control circuit to an overtemperature situation than would a temperature sensor placed in the environment of the semiconductor.

Among the known electric insulation materials, ceramics provide the best heat conductivity. Thus, for example, aluminium oxide ($Al_2O_3$) provides a heat conductivity of approximately 36-39 W/mK and aluminium nitride (AlN) even provides a heat conductivity of approximately 180-220 W/mK. Thus, these insulation materials are not only high-voltage resistant like ceramics, they also provide a heat conductivity that is many times better than that of organic carriers, and are thus preferable for use as carriers of the Pt resistor with a sintered layer.

Other planar components, on which at least the lower face meant for sintering is planar, is at least partly metallised (typically NiAu, NiPdAu, AgPd, AuPd or Ag) and is conductingly connected to the conducting path face by means of a sintering layer (for example porous silver), can be arranged in the same way. In this connection, it is already now possible to make only one electrical function contact on the face opposite to the sintered face as a metallic contact face. The always required second electrical function contact is then provided by the sinterable lower face (or a part of the lower face) of the component to the conductor path substrate. The top side contacting, for example, occurs by wire bonding or soldering or sintering or pressure contacting.

It is even possible to provide multiple resistors by stacking the square components. For example, it is possible, from a 10 ohm chip compensating resistor, to generate a larger, in the simplest case a doubled, resistance without enlarging the type diversity. Stacking of dimensionally smaller resistors on dimensionally larger resistors can be made, so that some kind of stepped pyramid occurs. This stepped arrangement is advantageous when mounting the semiconductor and applying supporting pressure during sintering. Different electrical resistor dimensions would also permit the combination of different resistance values. A 5 ohm resistor on a 10 ohm resistor results in a serial resistance of 15 ohm. The mechanical, electrical connection could then again be made by the sintering process.

According to the invention, however, the fact that both electrical function contacts are kept electrically isolatable in relation to the sintered face and are arranged on the top side of the component (this is the side opposite to the sintered face), permits an electrical contacting, which again is realised by optionally using wire bonding, soldering, sintering or pressure contacting or ultrasonic welding. If a substantial part of the top side is occupied by conductor paths for temperature measuring, contacting via contacts provided laterally on the edge of the top side is possible.

This arrangement consists of the two upper function contacts and the function face between the contacts and an electrically insulating carrying material (ceramic, monocrystals like sapphire or silicon). This results, for example, in the following layer design from the top downward of a resistor of the cuboid:
a. contact face for bonding
b. resistance function face
c. ceramic insulation member
d. metallised contact face for sintering This gives an electric component with connection faces for the contacting and a metallisation insulated therefrom for sintering on potential-carrying faces (conductor paths on substrates).

Basically, all commonly used conductor plates can be used as substrates: ceramic core conductor plates (DCB), metal core conductor plates (IMS), organic circuit carriers (for example epoxy resin core or polyimide core conductor plates).

The passive components have resistive, capacitive, inductive or temperature-resistive properties. These can be realised in special layers or layer sequences on insulating carrier materials (for example metallic layers for resistance forming (Ni, Pt)) or as a function in a volume (for example oxide metallic bodies with thermo-resistive properties, thermistors, NTC, PCT or resistive platinum metal resistance). In order to be suited as sinterable, passive component, the geometric shaping must be an electrically isolatable arrangement (both function contacts up).

BRIEF DESCRIPTION OF THE DRAWINGS

Further features and advantages of the invention occur from preferred embodiments as shown in the enclosed drawings, showing.

DETAILED DESCRIPTION

With temperature sensors, the location of such components on the substrate can take place according to different criteria. For the best possible temperature measuring of the blocking layer temperature by means of an external sensor, the shortest possible heat path between semiconductor and temperature sensor must be found.

It can be sintered directly on the current-conducting conductor path at a location in the immediate vicinity of one of the several semiconductors. This is particularly successful with the completely electrically isolatable temperature sensor with both contacts on top of the component. The temperature sensor can, for example, be of the type Pt-sensor (for example Pt-100) that consists of a ceramic substrate with sinterable metallisation at the bottom, a platinum function layer and two contact faces on top.

Also be a temperature sensor of the type thermistor (NTC) can be chosen, with sinterable metallisation at the bottom, a, for example ceramic, insulation layer, followed by a function volume and two contact faces on top. A thermistor or NTC is a heavily nonlinear temperature sensor consisting of resistance-oxides changing with the temperature. However, at the moment this is not available on a ceramic with insulating properties. However, also this variant of a thermistor will fall under the protection scope of the enclosed claims.

Different from these is a temperature sensor with a temperature sensitive platinum metal resistor that is made on an insulating ceramic with its two contact faces, for example a Pt-100 or a Pt-1000, that is, a resistive platinum metal resistor with a large linearity and a resistance of 100 ohm or 1000 ohm at 0° C. Finally, thermal elements are known, which work as temperature sensors, particularly according to the Seebeck effect (thermocouple). At the moment, however, they are also not available with an insulating ceramic layer.

Alternatively, the temperature sensor can be arranged on the semiconductor. This ensures a very short thermal path between the blocking layer of the semiconductor and the temperature sensor. This very close thermal tie has advantages for the fast detection of thermal overloads.

Figure 1:
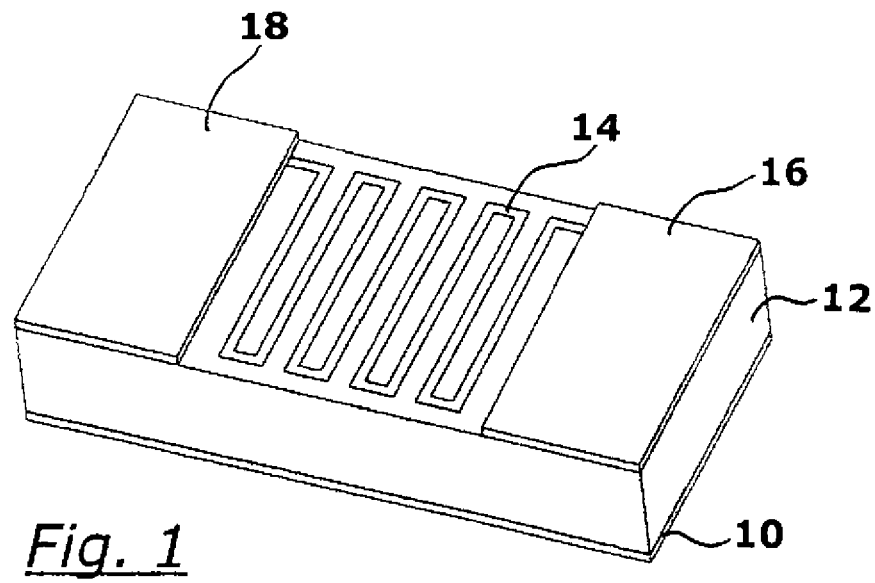
FIG. 1 an example of the embodiment of a sinterable temperature sensor.

FIG. 1 shows an example of the embodiment of a sinterable temperature sensor of the type Pt-1000. As explained above, this concerns an electrically isolatable embodiment with both electrical function contacts upwards. The layers and their materials from the bottom and upwards: sinterable metallisation 10 (typically NiAu, NiPdAu, AgPd, AuPd or Ag applied in accordance with chemical or physical methods), insulating ceramic body 12 (for example $Al_2O_3$), on top in the middle conductor paths 14 of Pt or alternatively Ni and two contact fields 16, 18 laterally for continued electrical connection (for example wire bonding) of, for example, AgPd or AuPd.

Figure 2:
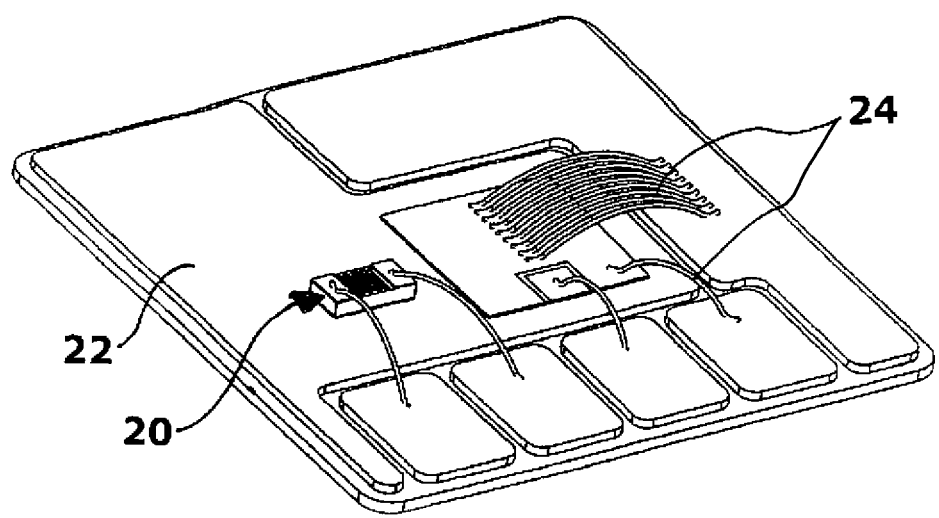
FIG. 2 a complete, sintered component group, in which the temperature sensor and an active component are arranged on the same conducting copper layer, a groove not extending between them, FIG. 3a a general embodiment, in which only one electrical function contact on the face opposite to the sintered face is made as a metallic contact face, FIG. 3b an example of the option of stacking resistors to achieve many times the basic resistance, and FIG. 4 an embodiment according to the invention, in which a double bond pad is located on the top side.

FIG. 2 shows an example of a complete, sintered component group consisting of a DCB substrate, a transistor and a temperature sensor (as in FIG. 1). The component group already has a contact wiring by bond wires 24, which is, however, not generated until after the sintering. The temperature sensor 20 in FIG. 2 is sintered in an electrically isolatable manner to the current conducting conductor path 22) and in this way has a very good thermal contact because of the silver sintering and at the same time a high electrical insulation by means of the non-conductive ceramic body 12. The disadvantageous generation of conductor path islands for the temperature sensor caused by additional space requirements and high thermal resistance does not occur.

Figure 3A:
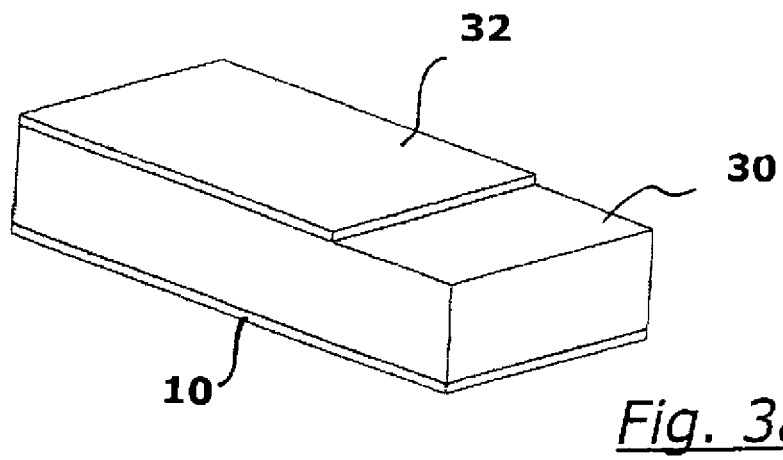
Figure 3B:
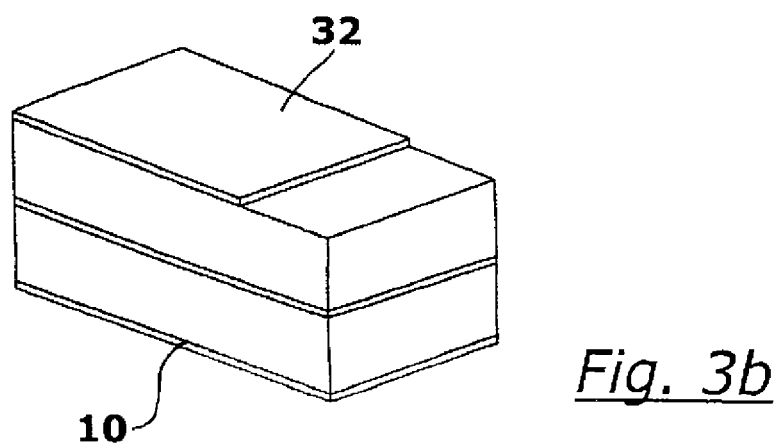

FIG. 3a shows a general embodiment of a sinterable passive component. It concerns the solution according to case 1 in a non electrically isolated embodiment with one of the electrical contacts 10, 32 downwards and one upwards, and covering at least a part of the surface. The body in the middle describes the function volume, for example with the passive electrical functions:

electrical resistance
thermally sensitive resistor (temperature sensor as NTC, PTC, Ptxx, Nixx)
electrical resistance for current measuring with thermally insensitive metal alloy (for example a shunt of a copper-manganese-nickel alloy)
electrical capacity
inductivity The layers and their materials from the bottom and upwards: sinterable metallisation 10 (typically NiAu, NiPdAu, AgPd, AuPd or Ag applied by means of chemical or physical methods), function body 30, a contact field 32 on top that completely or partly covers the top side and which is meant for the continued electrical connection (for example wire bonding), consisting of, for example, AgPd or AuPd.

Figure 4:
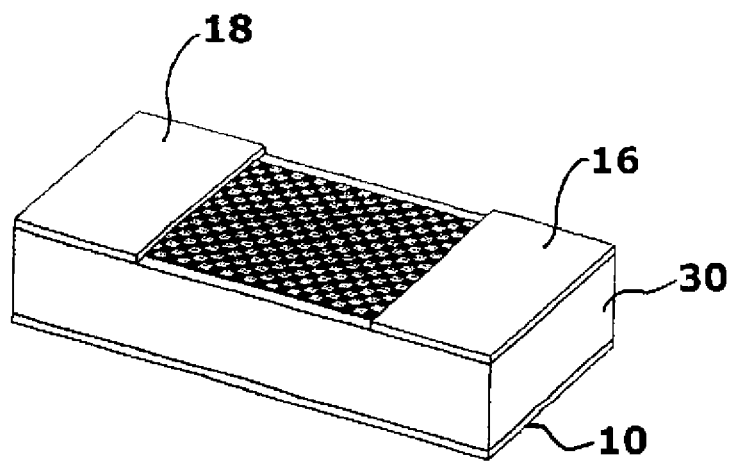

FIG. 4 shows a solution with the double bond pad on the top side. The layers and their materials from the bottom and upwards: sinterable metallisation 10 (typically NiAu, NiPdAu, AgPd, AuPd or Ag applied by means of chemical or physical methods), function body 30, two contact fields 16, 18 on top, which are separated by the surface of the contact body, partly covering the top side and meant for the continued electrical connection (for example wire bonding), consisting of, for example, AgPd or AuPd.

A further embodiment of the invention could be the combination of several sinterable components, firstly on a common carrier substrate (for example ceramic). In this case, several components form a common electrical function, for example an R-C link for a limiting function of voltage peaks. The components on the top side of the carrier substrate are then connected by conductor paths. On the top side the carrier substrate further comprises metallic faces for bonding and soldering, for example in the form of a ceramic hybrid circuit.

The carrier substrate itself is then metallised on the lower face in a sinterable manner and is sintered as a whole, with its connected components to the substrate of the power component group. Due to the sintered connection chosen, such a component group is also suited for high temperatures.

Although various embodiments of the present invention have been described and shown, the invention is not restricted thereto, but may also be embodied in other ways within the scope of the subject-matter defined in the following claims.

What is claimed is:

1. A method of manufacturing a sintered power semiconductor module with a sinterable temperature sensor, with the steps:
    making the temperature sensor in a planar shape with at least one planar lower face meant for sintering, and
    making an electrical contact area on the face opposite to the sintering face, said contact area being contactable on the top side by means of a commonly known method of the group: wire bonding or soldering or sintering or pressure contacting or ultrasonic welding,
    wherein on the lower face of the temperature sensor a sinterable metallisation is applied on a ceramic body, conductor paths of Pt or Ni being formed in the middle of the ceramic body and two top side contact faces being formed laterally on the ceramic body as electrical contact areas.

2. The method of manufacturing according to claim 1, wherein
    the location of two electrical contact faces to be kept electrically isolatable in relation to the sinter face of the top side of the ceramic body and
    electric contacting by optionally using wire bonding, soldering, sintering or pressure contacting on the top side of the contacts.

3. The power semiconductor according to claim 2, wherein a temperature sensor sintered onto the conductor layer holding the active component.

4. The method according to claim 1, wherein sintering is performed on a conductor path.

5. The power semiconductor according to claim 4, wherein a temperature sensor sintered onto the conductor layer holding the active component.

6. The method according to claim 1, wherein sintering is performed on the surface of an active component.

7. The power semiconductor according to claim 6, wherein a temperature sensor sintered onto the conductor layer holding the active component.

8. The power semiconductor according to claim 1, wherein a temperature sensor sintered onto the conductor layer holding the active component.

9. A method of manufacturing a sintered power semiconductor module with a sinterable temperature sensor, with the steps:
   making the temperature sensor in a planar shape with at least one planar lower face meant for sintering, and
   making an electrical contact area on the face opposite to the sintering face, said contact area being contactable on the top side by means of a commonly known method of the group: wire bonding or soldering or sintering or pressure contacting or ultrasonic welding,
   wherein on its lower face the temperature sensor is provided with a sinterable metallisation on a ceramic insulation layer, and
   on its function volume two electrical contact faces are provided to be electrically isolatable in relation to the sintered surface on the top side and
   electrical contacting of both contact faces after sintering occurs optionally by means of wire bonding, soldering, sintering or pressure contacting or ultrasonic welding on the top side of the contacts.

10. The method according to claim 9, wherein sintering is performed on a conductor path.

11. The method according to claim 9, wherein sintering is performed on the surface of an active component.

12. The power semiconductor according to claim 9, wherein a temperature sensor sintered onto the conductor layer holding the active component.

\* \* \* \* \*